United States Patent [19]
Brodie et al.

[11] Patent Number: 5,144,811
[45] Date of Patent: Sep. 8, 1992

[54] CONDENSATION CONTROL SYSTEM FOR WATER-COOLED ELECTRONICS

[75] Inventors: Eugene L. Brodie, Anaheim; Chris A. Jameson, Fullerton, both of Calif.

[73] Assignee: Hughes Aircraft Company, Los Angeles, Calif.

[21] Appl. No.: 639,604

[22] Filed: Jan. 10, 1991

[51] Int. Cl.$^5$ .............................. F25B 49/00
[52] U.S. Cl. ...................... 62/176.6; 62/259.2; 361/385
[58] Field of Search ............ 62/176.6, 201, 185, 62/259.2; 361/385; 357/81; 363/141; 236/44 R

[56] References Cited

U.S. PATENT DOCUMENTS 3,151,471 10/1964 Weil .................................. 62/259.2 X
4,512,161 4/1985 Logan et al. ........................ 62/176.6

Primary Examiner—William E. Wayner
Attorney, Agent, or Firm—Wanda Denson-Low

[57] ABSTRACT

A water cooling condensation control system having a water inlet line valve which is opened only when the equipment being cooled is receiving electrical power, an ambient temperature sensor for sensing the dry bulb temperature of the ambient air in the vicinity of the equipment being cooled, an ambient humidity sensor for sensing the relative humidity of the ambient air in the vicinity of the equipment being cooled, a return water temperature sensor for sensing the temperature of the return water in the cooling water return line, a return water flow control valve for controlling the amount of return water, an input water temperature sensor for sensing the temperature of the cooling water provided to the equipment via the cooling water inlet line, and a pump for controllably diverting return water from the return line to the inlet line. A microprocessor controller responsive to the ambient temperature sensor, the ambient humidity sensor and the return water temperature sensor for calculates the dewpoint of the ambient air in the vicinity of the equipment being cooled and controls the return water flow control valve to maintain the return water temperature above the dewpoint within a predetermined range, and further controls the pump to divert return water to the inlet line when the difference between the return water temperature and the inlet water temperature exceeds a predetermined value.

6 Claims, 2 Drawing Sheets

CONDENSATION CONTROL SYSTEM FOR WATER-COOLED ELECTRONICS

BACKGROUND OF THE INVENTION

The subject invention is generally directed to water cooling systems for electronic systems, and is directed more particularly to a condensation control system for water cooling systems.

Electronic systems such as naval shipboard electronic equipment including radar displays, sonar displays and tactical systems employ water cooling systems wherein chilled water is utilized as the heat exchange medium. The advantages of employing water cooling systems as compared to air cooling include less volume for the cooling water passages, less noise, and higher efficiency.

An important consideration with water cooling systems is the formation of condensation on the components of the cooling systems, since the condensate can cause electrical shorts, corrosion, as well as other types of damage to the system being cooled.

SUMMARY OF THE INVENTION

It would therefore be an advantage to provide a condensation control system for preventing condensation in a water cooling system for electronic systems.

Another advantage would be to provide an automatic condensation control system for preventing condensation in a water cooling system for electronic systems.

The foregoing and other advantages are provided by the invention in a water cooling condensation control system that includes an ambient temperature sensor for sensing the dry bulb temperature of the ambient air in the vicinity of the equipment being cooled, an ambient humidity sensor for sensing the humidity of the ambient air in the vicinity of the equipment being cooled, a return water temperature sensor for sensing the temperature of the return water, a valve for restricting the flow of the return in the return line, and control means responsive to the ambient temperature sensor, the ambient humidity sensor and the return water temperature sensor for calculating the dewpoint of the ambient air in the vicinity of the equipment being cooled and for controlling the valve to restrict the flow of return water to maintain the return water temperature above the dewpoint.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
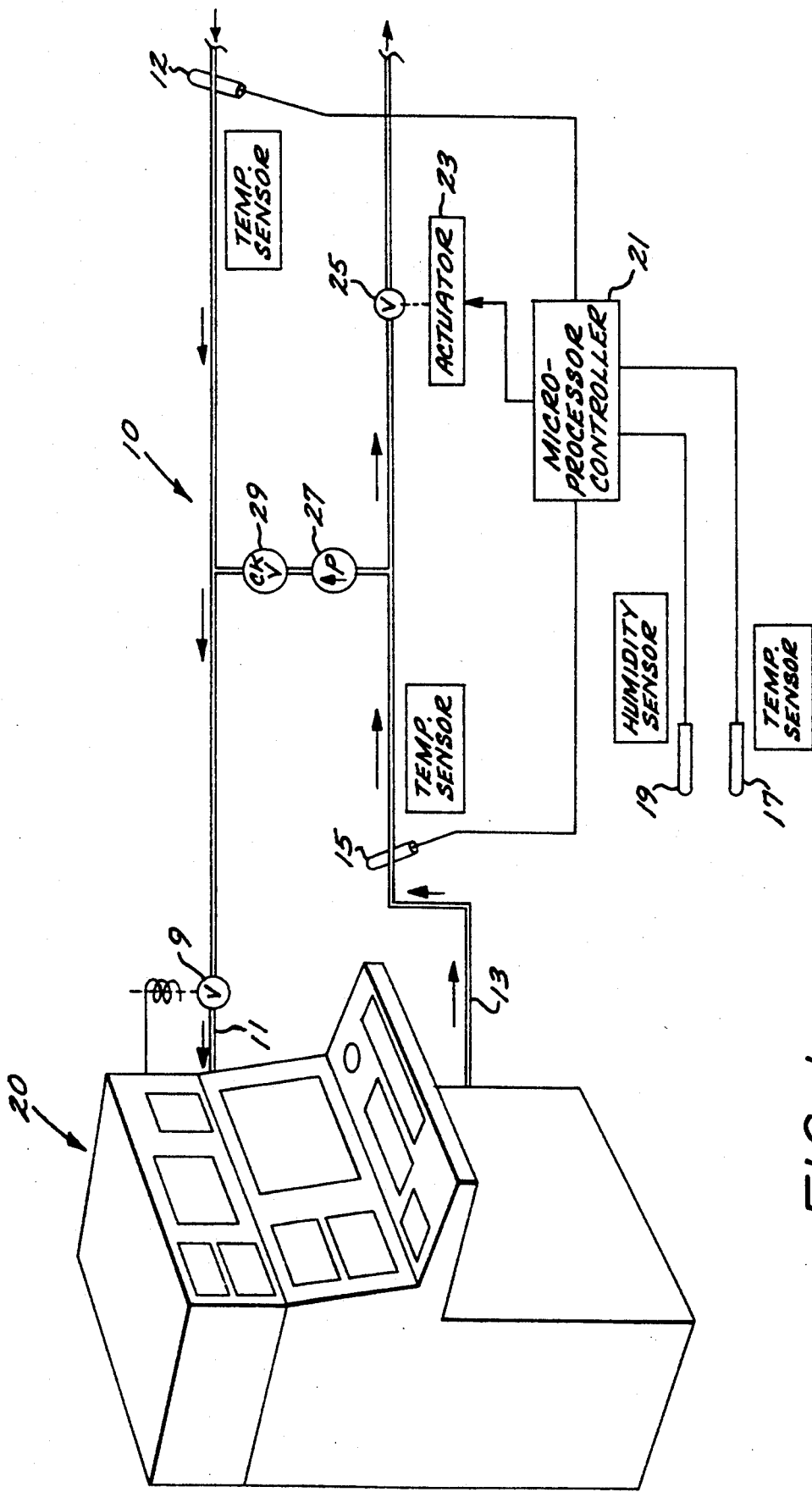
FIG. 1 is a block diagram of an implementation of a condensation control system in accordance with the invention.

In the following detailed description and in the several figures of the drawing, like elements are identified with like reference numerals.

Referring now to FIG. 1, shown therein is a condensation control system 10 which controls the temperature of the cooling water provided to an electronic system 20 so as to prevent formation of condensation on the water carrying cooling circuits in the electronic system. The cooling water is provided to the electronic system via an inlet line 11 and the heat containing water is removed via a return line 13.

The condensation control system includes an inlet line solenoid valve 9 which opens when electrical power is applied to the equipment, and then closes when power is removed from the equipment. Controlling water flow to take place only when the equipment is powered prevents condensation from occurring when there is no heat dissipation in the equipment.

An input water temperature sensor 12 senses the temperature $T_{IN}$ of the cooling water in the inlet line 11, and a return water temperature sensor 15 senses the temperature $T_R$ of the return water in the return line 13 of the cooling system. An ambient air temperature sensor 17 senses the dry bulb temperature $T_A$ of the ambient air, and a humidity sensor 19 senses the relative humidity $H_A$ of the ambient air.

The outputs of the input water temperature sensor 12, the return water temperature sensor 15, the ambient temperature sensor 17, and the humidity sensor 19 (typically voltages or currents) are provided to a microprocessor controller 21 which converts the sensor outputs to digital signals for processing.

The microprocessor controller 21 is configured to calculate the dewpoint DP of the ambient air based on the ambient air dry bulb temperature and humidity, wherein dewpoint refers to the temperature to which the ambient air must be cooled for visible moisture to be formed, and to adjust a valve 25 via a valve actuator 23 so as to maintain the return water temperature $T_R$ above the dewpoint DP and within a predetermined range. In particular, the return water flow is reduced when the return water temperature $T_R$ needs to be increased, and is increased when the return water temperature needs to be decreased.

The microprocessor controller 21 is further configured to prevent the return water temperature $T_R$ from exceeding a predetermined maximum return water temperature $T_{RMAX}$, whereby the valve 25 will be fully open even if the return water temperature $T_R$ is not above the dewpoint DP. In other words, return water flow will not be restricted if restriction would cause the return water temperature to exceed the predetermined maximum return water temperature $T_{RMAX}$.

The condensation control system further includes a pump 27 which controlled by the microprocessor controller to divert return water from the return line 13 to the inlet line 11 via a check valve 29 In particular, the pump 27 is activated when the difference between the return water temperature $T_R$ and the inlet water temperature TIN exceeds a predetermined amount, so as to increase the cooling water flow rate through the cooling circuits and to maintain turbulent flow through the cooling circuits to prevent laminar flow and/or starving in some of the cooling circuits. In other words, the pump 27 is controlled so as to maintain the inlet water and return water temperature difference below a predetermined amount.

Figure 2:
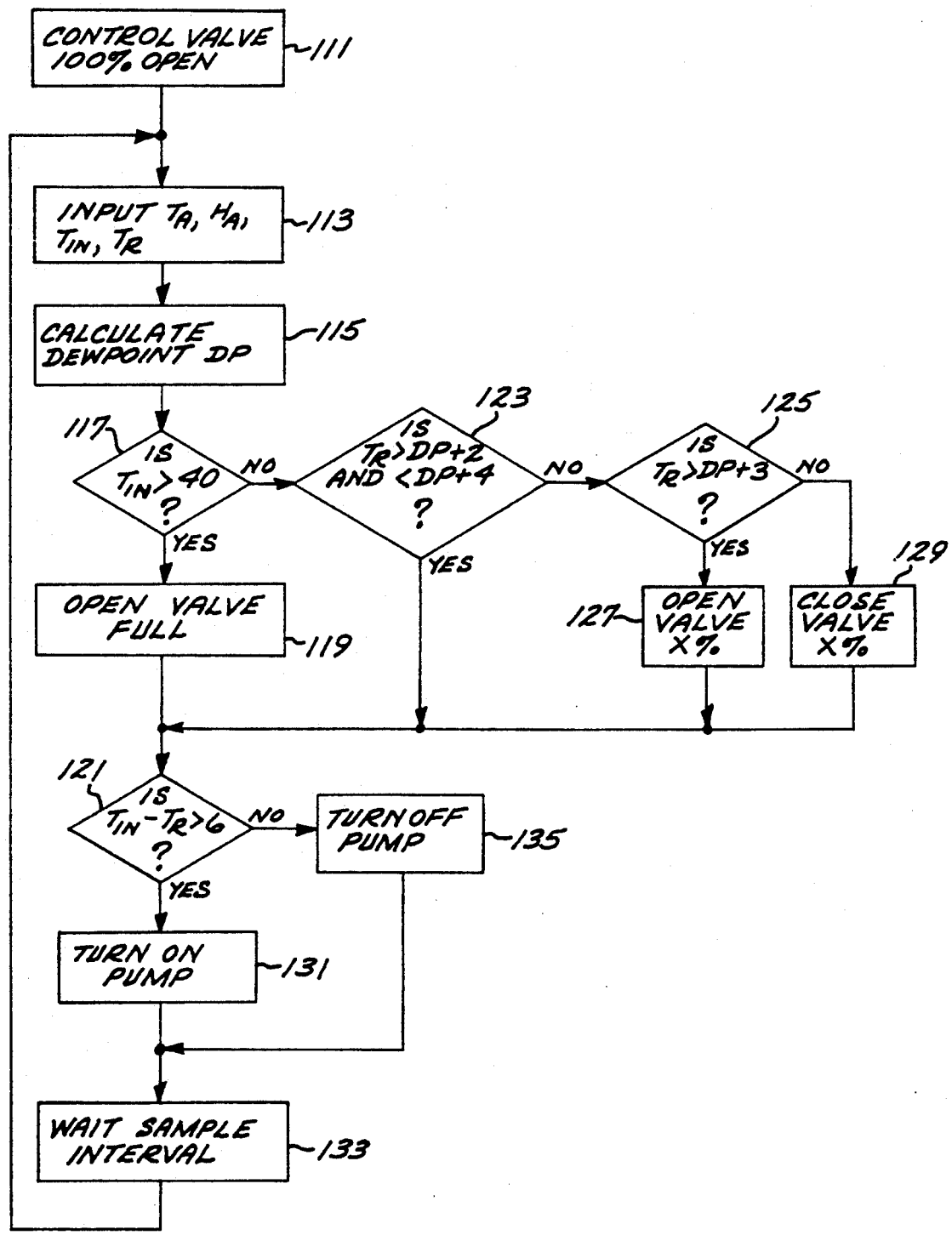
FIG. 2 is a flow diagram illustrating the operation of the condensation control system of FIG. 1.

Referring now to FIG. 2, shown therein is a flow diagram of an illustrative example of the operation of the condensation control system. When the control system is initially enabled, the control valve 25 is opened fully at 111. At 113 the present values for the ambient dry bulb temperature $T_A$, ambient humidity $H_A$, inlet water temperature $T_{IN}$, and return water temperature $T_R$ are input by the microprocessor controller. The dewpoint DP is then calculated at 115 from the input values for ambient temperature and humidity. At 117 a determination is made as to whether the inlet temperature $T_{IN}$ is greater than 40 degrees C. If yes, the valve is opened fully at 119, and control transfers to a determination at 121.

If the determination at 117 is no, the inlet water temperature $T_{IN}$ is not greater than 40 degrees C., a determination is made at 123 as to whether the return water temperature $T_R$ is (a) greater that the dewpoint DP plus 2 degrees, and (b) less than the dewpoint DP plus 4 degrees. If yes, the setting of the valve 25 is not changed, and processing transfers to the determination at 121.

If the determination at 123 is no, a determination is made at 125 as whether the return water temperature $T_R$ is greater than the dewpoint DP plus 3 degrees. If yes, at 127 the valve 25 is opened a predetermined amount identified as X%, and then processing continues with the determination at 121. If the determination at 125 is no, at 129 the control valve 25 is closed by the predetermined amount X%, and processing continues with the determination at 121.

The determination at 121 is whether difference between the return water temperature $T_R$ and the inlet water temperature $T_{IN}$ is greater than 6 degrees. If yes, the pump 27 is turned on at 131, and processing is suspended for a predetermined sample interval at 133. If the determination at 121 is not, the pump 27 is turned off at 135, and processing is suspended for a predetermined sample interval at 133.

After the predetermined sample interval at 133 has elapsed, processing continues at 113 for input of current values of the ambient dry bulb temperature, the ambient humidity, the inlet water temperature, and the return water temperature.

The foregoing has been a disclosure of an automatic condensation control system for preventing condensation in a water cooling system for electronic systems which advantageously utilizes heat rejected to warm the cooling water to prevent condensation, and which advantageously recirculates the return water when appropriate to maintain turbulent flow in the cooling circuits.

Although the foregoing has been a description and illustration of specific embodiments of the invention, various modifications and changes thereto can be made by persons skilled in the art without departing from the scope and spirit of the invention as defined by the following claims.

We claim:

1. A condensation control system for a water cooling system that includes an inlet line and a return line connected to electronic equipment being cooled, the condensation control system comprising:
   an ambient temperature sensor for sensing the dry bulb temperature of the ambient air in the vicinity of the equipment being cooled;
   an ambient humidity sensor for sensing the humidity of the ambient air in the vicinity of the equipment being cooled;
   a return water temperature sensor for sensing the temperature of the return water;
   flow control means for controlling the amount of return water flow in the return line; and control means responsive to said ambient temperature sensor, said ambient humidity sensor and said return water temperature sensor, said control means calculating the dewpoint of the ambient air in the vicinity of the equipment being cooled from the ambient temperature and the ambient humidity of said ambient air, said control means controlling said flow control means so as to maintain the return water temperature above the dewpoint.

2. The condensation control system of claim 1 wherein the return water temperature is maintained above the dewpoint within a predetermined range, and wherein said flow control means comprises a valve which is controlled to (a) decrease the flow of return water when the return water temperature is to be increased, and (b) increase the flow of return water when the return water temperature is to be decreased.

3. The condensation control system of claim 1 further comprising:
   an input water temperature sensor for sensing the temperature of the cooling water provided to the equipment via the inlet line;
   pumping means controlled by said control means for controllably diverting return water from the return line to the inlet line when the difference between the return water temperature and the inlet water temperature exceeds a predetermined value.

4. The condensation control system of claim 1 further including an inlet line valve which is opened only when the equipment being cooled is receiving electrical power.

5. A condensation control system for a water cooling system that includes an inlet line and a return line connected to electronic equipment being cooled, the condensation control system comprising:
   an inlet line valve which is opened only when the equipment being cooled is receiving electrical power;
   an ambient temperature sensor for sensing the dry bulb temperature of the ambient air in the vicinity of the equipment being cooled;
   an ambient humidity sensor for sensing the humidity of the ambient air in the vicinity of the equipment being cooled;
   a return water temperature sensor for sensing the temperature of the return water;
   flow control means for controlling the amount of return water flow in he return line; and
   an input water temperature sensor for sensing the temperature of the cooling water provided to the equipment via the inlet line;
   pumping means for controllably diverting return water from the return line to the inlet line; and
   control means responsive to said ambient temperature sensor, said ambient humidity sensor and said return water temperature sensor, said control means calculating the dewpoint of the ambient air in the vicinity of the equipment being cooled from the ambient temperature and the ambient humidity of said ambient air, said control means controlling said flow control means so as to maintain the return water temperature above the dewpoint, and for controlling said pumping means to divert return water to the inlet line when the difference between the return water temperature and the inlet water temperature exceeds a predetermined value.

6. The condensation control system of claim 5 wherein the return water temperature is maintained above the dewpoint within a predetermined range, and wherein said flow control means comprises a valve which is controlled to decrease the flow of return water when the return water temperature is to be increased, and is controlled to increase the flow of return water when the return water temperature is to be decreased.

* * * * *